United States Patent
Nakaoka et al.

(10) Patent No.: US 6,337,500 B1
(45) Date of Patent: Jan. 8, 2002

(54) SEMICONDUCTOR DEVICE AND METHOD FOR FABRICATING THE SAME

(75) Inventors: Hiroaki Nakaoka; Hiromasa Fujimoto; Atsushi Hori; Takashi Uehara, all of Osaka; Takehiro Hirai, Shiga, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/099,195

(22) Filed: Jun. 18, 1998

(30) Foreign Application Priority Data

Jun. 19, 1997 (JP) ............................................. 9-162178

(51) Int. Cl.[7] .......................... H01L 27/01; H01L 27/12; H01L 31/0392
(52) U.S. Cl. ....................................... 257/349; 257/347
(58) Field of Search ................................. 257/347, 348, 257/349, 373, 376, 339, 345, 394, 398, 399, 400, 402, 403, 611

(56) References Cited

U.S. PATENT DOCUMENTS

| | | | | |
|---|---|---|---|---|
| 4,946,799 A | * | 8/1990 | Blake et al. | 438/154 |
| 4,965,213 A | * | 10/1990 | Blake | 438/154 |
| 5,185,280 A | * | 2/1993 | Houston et al. | 438/163 |
| 5,208,472 A | * | 5/1993 | Su et al. | 257/344 |
| 5,360,752 A | * | 11/1994 | Brady et al. | 438/459 |
| 5,578,865 A | * | 11/1996 | Vu et al. | 257/611 |
| 5,936,278 A | * | 8/1999 | Hu et al. | 257/336 |
| 5,982,002 A | * | 11/1999 | Takasu et al. | 257/347 |

* cited by examiner

Primary Examiner—Tom Thomas
Assistant Examiner—Shouxiang Hu
(74) Attorney, Agent, or Firm—McDermott, Will & Emery

(57) ABSTRACT

In a silicon layer formed on an insulator layer, a lattice defect region is formed to be adjacent to a channel region and source/drain regions, and the lower part of the channel region functions as a high-concentration channel region. The holes of hole-electron pairs generated in the channel region are eliminated by recombination in the lattice defect region, thereby suppressing the bipolar operation resulting from the accumulation of holes and increasing the source/drain breakdown voltage. The threshold value of a parasitic transistor is increased by the high-concentration channel region so as to reduce the leakage current in the OFF state. Alternatively, the holes may be moved to the source region to disappear therein by providing, instead of the lattice defect region, a high-concentration diffusion layer constituting and operating as a pn diode between the channel and source regions. Thus, it is possible to provide an SOI transistor causing no decrease in the source/drain breakdown voltage resulting from substrate floating effects and causing little OFF leakage current because of the activation of the parasitic transistor.

5 Claims, 12 Drawing Sheets

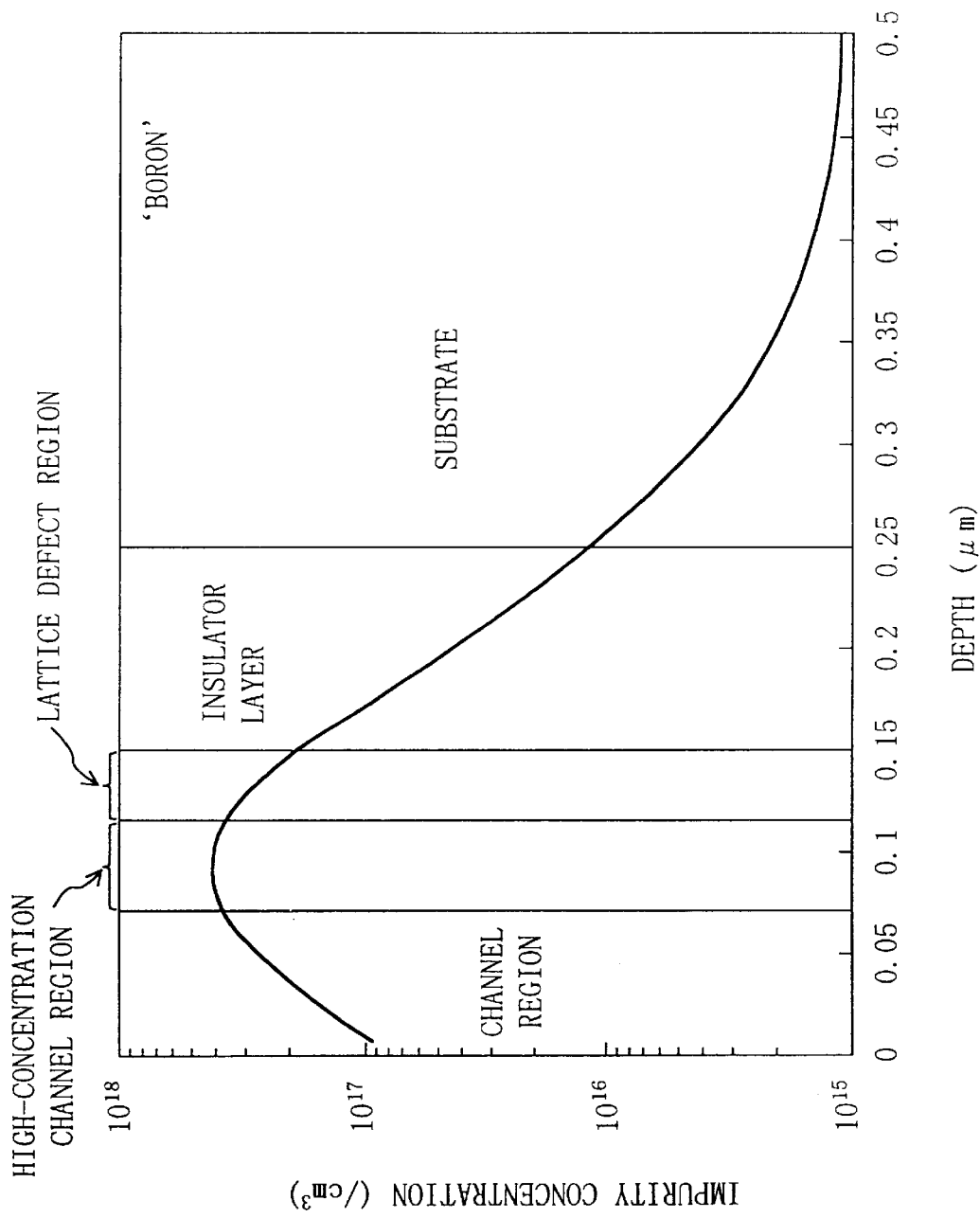

Id-Vg PROPERTY

SEMICONDUCTOR DEVICE AND METHOD FOR FABRICATING THE SAME

BACKGROUND OF THE INVENTION

The present invention relates to a semiconductor device formed on an insulator substrate or on an SOI (silicon on insulator) substrate in which a single crystalline silicon thin film is formed on an insulator film, and also related to a method for fabricating the semiconductor device.

In recent years, in the field of portable communication units such as cellular phone units, a device operating with low voltage, high speed, and low consumption power has been demanded. In order to satisfy these requirements or realize these properties, various attempts have been vigorously carried on by forming a transistor on an insulator substrate or on an SOI substrate, in which a semiconductor film is formed on an insulator film (hereinafter, simply referred to as an SOI transistor), and thereby reducing the parasitic capacitance or the like.

The structure of the conventional SOI transistor will be described with reference to the drawings.

FIG. 11 is a cross-sectional view of the conventional SOI transistor.

As shown in FIG. 11, an insulator layer 702 of an oxide film is formed on a p-type single crystalline silicon substrate 701. A silicon layer 703 used as the active region of the transistor is formed on the insulator layer 702. A LOCOS film 704 is formed for the purpose of isolating respective regions of the silicon layer 703 from each other just like islands. A gate oxide film 705 is selectively formed on each of the isolated regions of the silicon layer 703, and a gate electrode 707 of a polysilicon film is formed on the gate oxide film 705. Sidewalls 708 are formed on the sides of the gate electrode 707. A channel region 714 is formed in the silicon layer 703 just under the gate oxide film 705 and sandwiched by a source region 709 and a drain region 710, which contain a high-concentration impurity. An interlevel insulator film 711 of a BPSG film or the like, contact holes 712, and a metal interconnection layer 713 as an electrode are formed on the LOCOS film 704, the gate electrode 705, the source region 709 and the drain region 710.

FIGS. 12a to 12e are cross-sectional views depicting the fabricating process of the conventional SOI transistor.

SOI substrates can be classified into SIMOX substrates, bonded substrates, and other types of substrates. The SOI substrate to be described herein has a three-layer structure: a silicon substrate 701; an insulator layer 702 of a silicon oxide film 701 formed thereon; and a silicon layer 703 formed further thereon as the uppermost layer.

First, as shown in FIG. 12a, the LOCOS film 704 is formed by selective oxidation technique by using a mask consisting of a pad oxide film 721 and a silicon nitride film 722, thereby isolating the respective regions of the silicon layer 703 from each other just like islands.

Then, as shown in FIG. 12b, after removing the pad oxide film 721 and the nitride film 722, a p-type impurity is implanted in order to control the threshold value.

Next, as shown in FIG. 12c, after forming a silicon oxide film and a polysilicon film in this order on the silicon layer 703, the gate oxide film 705 and the gate electrode 707 are formed by patterning, and then the sidewalls 708 are formed on the sides of the gate electrode 707.

Subsequently, as shown in FIG. 12d, n-type impurity ions are implanted into the silicon layer 703 by using the gate electrode 707 as mask, thereby forming the source region 709 and the drain region 710 in a self-aligned manner.

Finally, as shown in FIG. 12e, after the interlevel insulator film 711 is deposited, the contact holes 712 are formed in the interlevel insulator film 711. After the metal interconnection layer 713 is deposited to fill up the contact holes 712 and to extend over the interlevel insulator film 711, the layer 713 is patterned.

By performing these process steps, the SOI transistor shown in FIG. 11 is completed.

However, such an n-channel-type SOI transistor where the silicon layer formed on the SOI substrate is isolated by the LOCOS film and the potential of the channel region is electrically floating, has the following two problems.

Firstly, in an MOS transistor, if the drain voltage is high enough, the electrons implanted into the channel region from the source region have so high energy in a region near the drain that that they cause impact ionization and generate hole-electron pairs. In a normal bulk transistor, generated electrons move to the drain region while the holes move to the inside of the substrate, causing not so serious problem. However, in the SOI transistor where the channel region 714 is electrically floating, holes are accumulated in a region of the electrically floating channel region 714 in the vicinity of the source region 709. Then, the accumulated holes lower the energy barrier between the source region and the channel region, causing a bipolar operation due to the amplification action similar to that of a bipolar transistor and increasing the current flowing in the channel region. This causes a problem that the source-drain breakdown voltage decreases.

Secondly, the use of a LOCOS film for the isolation of transistors generally causes a bird's beak in the isolated area. Thus, in the process step shown in FIG. 12b, the impurity concentration implanted into the portion of the silicon layer 703 under the bird's beak becomes lower than that of the other channel region 714. As a result, a parasitic transistor, i.e., a so-called an edge transistor, where the portion under the bird's beak becomes a channel region, is formed.

FIGS. 13a and 13b are respectively a plan view and a cross-sectional view taken along the line XIII—XIII for illustrating edge transistors formed on both ends of a main transistor, which is an original SOI transistor. As shown in FIG. 13a, in addition to the current (see the bold arrow in FIG. 13a) flowing through the main transistor, current also flows through the edge transistors generated on both ends (see the fine arrows in FIG. 13a). In an SOI transistor having no well structure, since the impurity concentration in the silicon layer just under the bird's beak is lower than that of the channel region, the threshold value of the edge transistors becomes lower than that of the main transistor. Consequently, as shown in FIG. 14, if the voltage to be applied to the gate electrode is being increased, the edge transistors are turned ON before the main transistor is turned ON. As a result, the sub threshold property has a hump, causing a problem that the leakage current during the stand-by mode of the transistor increases.

SUMMARY OF THE INVENTION

An object of the present invention is to improve the reliability of an SOI transistor, formed to be isolated by a LOCOS film on a region on an SOI substrate and having a channel region with an electrically floating potential, by increasing source/drain breakdown voltage and by preventing leakage current from increasing during the stand-by thereof.

In order to accomplish this object, the present invention provides a region for eliminating carriers in the vicinity of the channel region of the SOI transistor such as a lattice defect region containing a lot of lattice defects functioning as the center of recombination, and/or a high-concentration diffusion region constituting a diode between the source/drain regions.

The semiconductor device of the invention includes: a substrate having an insulator layer thereon; a semiconductor layer of a first conductivity type formed on the insulator layer, part of the semiconductor layer functioning as a channel region; a gate insulator film formed on the channel region of the semiconductor layer; a gate electrode formed on the gate insulator film; source/drain regions of a second conductivity type formed in the semiconductor layer so as to sandwich the channel region therebetween; and a hole-eliminating region having a function of preventing the accumulation of holes of hole-electron pairs generated in the channel region, the hole-eliminating region being formed in a region of the semiconductor layer and adjacent to one of the source/drain regions and to the channel region.

In such a structure, when hole-electron pairs are generated in the channel region during the operation of the semiconductor device, the holes gather in parts of the channel region in the vicinity of the source/drain regions or in the source/drain regions. However, the holes are soon eliminated because the hole-eliminating region is provided to be adjacent to the channel region and either the source region or the drain region. Consequently, no bipolar operation results from the accumulation of holes, thereby maintaining the source/drain breakdown voltage at a high level.

In the semiconductor device, the hole-eliminating region may include two separate regions in the semiconductor layer, one of the two regions being adjacent to the source and channel regions, while the other region of the two being adjacent to the drain and channel regions.

In such a structure, in both regions neighboring the source/drain regions, holes are eliminated as a result of recombination. Thus, no bipolar operation results from the accumulation of holes, no matter how the level relationship varies between the voltages applied to the source/drain regions of the semiconductor device.

The semiconductor device may further include an on-gate silicide film formed on the gate electrode and on-substrate silicide films formed on the source/drain regions, respectively, each of the on-substrate silicide films being spaced from the gate electrode via a gap. The hole-eliminating regions may be located below the respective gaps between the on-substrate silicide films and the gate electrode.

As a result, a semiconductor device having reduced gate and/or contact resistance can be obtained, in addition to the above-mentioned effects.

In the semiconductor device, the hole-eliminating region may be a lattice defect region formed by introducing a latice defect to be a center of recombination.

In such a structure, even if the holes of hole-electron pairs generated in the channel region gather in the regions of the channel region neighboring the source/drain regions or in the source/drain regions, the holes are recombined with electrons and soon eliminated in a lattice defect region containing a lot of lattice defects to be the center of recombination.

In the semiconductor device including the lattice defect region, the lower part of the channel region is preferably a high-concentration channel region containing an impurity of the second conductivity type having a concentration higher than a concentration in the channel region.

In such a structure, the threshold voltage of a parasitic transistor, operating in the semiconductor device separately from the original transistor by using a region of the semiconductor layer neighboring the boundary between the element isolation and the semiconductor layer as a channel region, is increased. Therefore, as represented by the sub-threshold characteristics thereof, the original semiconductor device is first turned ON and then the parasitic transistor is turned ON. In particular, if the element isolation is formed of a LOCOS film, the threshold voltage of the parasitic transistor is increased because of the presence of a high-concentration channel region even in a part of the semiconductor layer below the bird's beak of the LOCOS film. That is to say, since the operation of the parasitic transistor is restricted when a low voltage is applied to the gate, a hump can be eliminated from the sub-threshold characteristics and OFF leakage current is reduced.

The lattice defect region may be formed to entirely cover lower parts of the source, drain and channel regions in the semiconductor layer.

In such a structure, since a region for eliminating holes becomes larger, the holes of the hole-electron pairs are eliminated sooner. Furthermore, the fabricating process can be simplified because the atoms generating lattice defects may be introduced into the entire surface of the substrate.

The same impurity may be introduced into the lattice defect region and the high-concentration channel region.

In such a structure, both lattice defect region and high-concentration channel region can be simultaneously formed by introducing impurity only once if the peak of the impurity concentration is controlled by utilizing the fact that the lattice defects are generated when the impurity concentration reaches a certain level. As a result, the fabrication process can be simplified and the fabrication costs can be reduced.

If the semiconductor device is an n-channel type transistor, atoms of a Group 3b element having a larger atomic radius than an atomic radius of an element composing the semiconductor layer may be introduced into the lattice defect region.

Consequently, the number of lattice defects in the lattice defect region increases, which enhances the function of eliminating the holes.

If the semiconductor layer is composed of silicon single crystals, the Group 3b element is preferably at least one of gallium, indium and thallium.

Atoms of a Group 4b element may be introduced into the lattice defect region.

In such a case, the electrical properties of the semiconductor layer are not adversely affected by the atoms introduced into the lattice defect region.

The Group 4b element is preferably at least one of carbon, silicon and germanium.

The atoms of a Group 0 element (inert gas) may be introduced into the lattice defect region.

In such a case, the electrical properties of the semiconductor layer are not adversely affected by the atoms introduced into the lattice defect region.

The Group 0 element is preferably at least one of argon, krypton and xenon.

In the semiconductor device, the hole-eliminating region may be a high-concentration diffusion layer containing an impurity of a second conductivity type having a concentration higher than a concentration in the channel region.

Consequently, PN diodes are constituted by the high-concentration diffusion layer and the source/drain regions.

Thus, even if the holes of hole-electron pairs generated in the channel region gather in the parts of the channel region neighboring the source/drain regions or in the source/drain regions, the holes flow to the source/drain regions and are eliminated soon.

$10^{19}$ to $10^{21}$ impurity atoms/cm$^3$ of the second conductivity type are preferably introduced into the high-concentration diffusion region.

The first method for fabricating a semiconductor device according to the present invention includes the steps of: (a) forming an element isolation film on an SOI substrate including at least an insulator layer and a semiconductor layer formed on the insulator layer, the element isolation film surrounding the semiconductor layer; (b) forming a lattice defect region, a high-concentration channel region and a channel region in the semiconductor layer by implanting, into the semiconductor layer, impurity ions of a first conductivity type, having an atomic radius larger than an atomic radius of an element composing the semiconductor layer, such that a concentration of the semiconductor layer reaches a maximum in a region in the vicinity of an interface between the semiconductor layer and the insulator layer; (c) forming a gate insulator film on the semiconductor layer; (d) forming a gate electrode on the gate insulator film; (e) forming source/region regions in respective regions of the semiconductor layer by introducing an impurity of a second conductivity type into the semiconductor layer by using the gate electrode as a mask, the source/drain regions being located on right and left sides of the gate electrode; and (f) diffusing and activating the impurity of the first conductivity type and the impurity of the second conductivity type by heat treatment.

According to this method, the lattice defect region can be formed to entirely cover the lower part of the semiconductor layer, and the high-concentration channel region and the channel region can be formed thereon by implanting impurity ions having a larger atomic radius than that of the element composing the semiconductor layer only once. Thus, a semiconductor device attaining the above-mentioned effects can be obtained by performing an extremely small number of process steps.

In the first method for fabricating a semiconductor device, if the semiconductor device is an n-channel type transistor, then ions of a Group 3b element may be used as the impurity ions of the first conductivity type in the step (b).

According to this method, a p-type channel region and the high-concentration channel region can be formed simultaneously with the lattice defect region. Thus, an SOI transistor having an excellent source/drain breakdown voltage can be obtained for an n-channel-type MOS transistor causing a problem of bipolar operation.

If the semiconductor layer is composed of silicon single crystals, then ions of at least one of gallium, indium and thallium are used as the ions of the Group 3b element in the step (b).

Since any of these elements has an atomic radius larger than that of silicon widely used for semiconductor layer, a larger number of lattice defects can be generated by introducing a smaller amount of impurity.

The second method for fabricating a semiconductor device according to the present invention includes: (a) forming an element isolation film on an SOI substrate including at least an insulator layer and a semiconductor layer formed on the insulator layer, the element isolation film surrounding the semiconductor layer; (b) implanting, into the semiconductor layer, ions of an element having such properties as causing lattice defects in the semiconductor layer, such that a concentration of the semiconductor layer reaches a maximum in a region in the vicinity of an interface between the semiconductor layer and the insulator layer; (c) forming a high-concentration channel region and a channel region by implanting impurity ions of a first conductivity type into the semiconductor layer such that the concentration of the semiconductor layer reaches a maximum in a bottom region of the semiconductor layer; (d) forming a gate insulator film on the semiconductor layer; (e) forming a gate electrode on the gate insulator film; (f) forming source/region regions in respective regions of the semiconductor layer by introducing an impurity of a second conductivity type into the semiconductor layer by using the gate electrode as a mask, the source/drain regions being located on right and left sides of the gate electrode; and (g) diffusing and activating the impurity of the first conductivity type and the impurity of the second conductivity type by heat treatment.

This method requires additional process steps as compared with the first method for fabricating a semiconductor device. However, a semiconductor device attaining the above-described effects can be obtained with more certainty.

In the second method for fabricating a semiconductor device, the types of atoms to be introduced for forming a lattice defect region may be selected as will be described below in the same manner as in the invention relating to the semiconductor device.

In the second method for fabricating a semiconductor device, in the step (b), ions of a Group 4b element may be used as the ions of the element having such properties as causing the lattice defects.

In the step (b), ions of at least one of carbon, silicon and germanium may be used as the ions of the Group 4b element.

In the second method for fabricating a semiconductor device, in the step (b), ions of a Group 0 element may be used as the ions of the element having such properties as causing the lattice defects.

In the step (b), ions of at least one of argon, krypton and xenon are preferably used as the ions of the Group 0 element.

The third method for fabricating a semiconductor device according to the present invention includes the steps of: (a) forming an element isolation film on an SOI substrate including at least an insulator layer and a semiconductor layer formed on the insulator layer, the element isolation film surrounding the semiconductor layer; (b) forming a semiconductor layer of a first conductivity type including at least a channel region in the semiconductor layer by introducing an impurity of the first conductivity type into the semiconductor layer; (c) forming a gate insulator film on the semiconductor layer; (d) forming a gate electrode on the gate insulator film; (e) forming insulator sidewalls on both side faces of the gate electrode; (f) forming source/drain regions in respective regions of the semiconductor layer by introducing an impurity of a second conductivity type into the semiconductor layer by using the gate electrode and the insulator sidewalls as a mask, the source/drain regions being located on right and left sides of the gate electrode; (g) forming silicide films on the gate electrode and the source/drain regions, respectively; (h) selectively removing the insulator sidewalls; (i) implanting ions of a hole-eliminating element into the semiconductor layer by using the silicide films as a mask such that a concentration of the semiconductor layer reaches a maximum in a region in the vicinity of an interface between the insulator layer and the semiconductor layer; and (j) diffusing and activating the impurity of the first conductivity type and the impurity of the second conductivity type by heat treatment.

According to this method, a hole-eliminating element can be introduced only into limited parts of the channel region in the vicinity of the ends thereof. Thus, it is possible to prevent with certainty the hole-eliminating element from adversely affecting the characteristics of the source/drain regions (such as an increase in source/drain resistance, junction leakage or junction capacitance).

In such a case, in the step (i), ions of an element having such properties as causing lattice defects may be used as the ions of the hole-eliminating element.

Moreover, in the step (b), the impurity ions of the first conductivity type are preferably implanted into the semiconductor layer such that a concentration of the semiconductor layer reaches a maximum in a bottom region of the semiconductor layer, thereby forming a high-concentration channel region and the channel region in the semiconductor layer.

In the third method for fabricating a semiconductor device, in the step (i), impurity ions of the first conductivity type having a concentration higher than a concentration in the channel region may be used as the ions of the hole-eliminating element.

In such a case, the dose of the impurity ions of the first conductivity type is preferably set at $5 \times 10^{13}/\text{cm}^2$ or larger.

BRIEF DESCRIPTION OF THE DRAWINGS

FIG. 5 is a graph showing the distribution of impurity concentration in a semiconductor layer which is produced by impurity ion implantation in the process for fabricating a semiconductor device in the fourth embodiment.

DETAILED DESCRIPTION OF THE INVENTION

Embodiment 1

Figure 1:
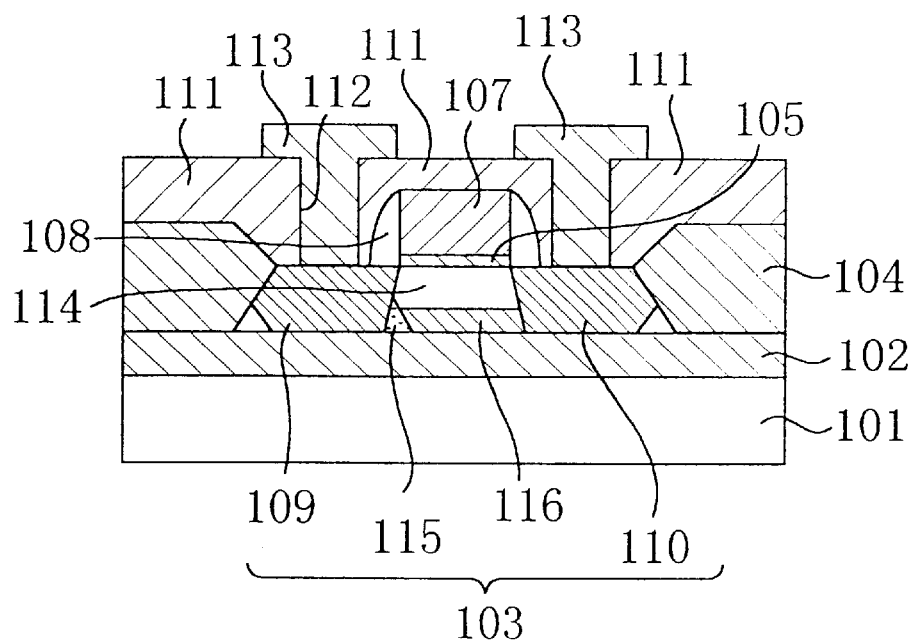
FIG. 1 is a cross-sectional view of an SOI transistor in the first embodiment.

FIG. 1 is a cross-sectional view of a semiconductor device of the first embodiment. As shown in FIG. 1, an insulator layer 102 of an oxide film having a thickness of 80 nm is formed on a p-type single crystalline silicon substrate 101. A silicon layer 103 having a thickness of 100 nm and functioning as an active region for a transistor is formed on the insulator layer 102. A LOCOS film 104 having a thickness of 280 nm is formed to isolate the respective active regions of the silicon layer 103 from each other just like islands. A gate oxide film 105 having a thickness of 7 nm is selectively formed on each of the island-shaped, isolated regions of the silicon layer 103, and a gate electrode 107 of polysilicon having a thickness of 200 nm is formed on the gate oxide film 105. Sidewalls 108 having a bottom width of 100 nm are formed on both side faces of the gate electrode 107. The silicon layer 103 includes: a p$^-$-type channel region 114 formed under the gate electrode 107; and source/drain regions 109, 110, formed of an n$^+$ diffusion layer, sandwiching the channel region 114 therebetween. An interlevel insulator film 111 having a thickness of 1000 nm is formed over the LOCOS film 104, the gate electrode 107, the source region 109 and the drain region 110. Contact holes 112 having a diameter of 0.5 $\mu$m and reaching the source/drain regions 109, 110 are formed through the interlevel insulator film 111. Furthermore, a metal interconnection layer 113 of aluminum, having a thickness of 700 nm and functioning both as a filling layer for filling up the contact holes 112 and as an electrode, is formed.

This embodiment is characterized by a lattice defect region 115 formed at the bottom of the silicon layer 103 to be in contact with the channel region 114 and the source region 109 by introducing thereto lattice defects as the center of recombination. In addition, in this embodiment, the lower part of the channel region 114 functions as a high-concentration channel region 116 having an impurity concentration higher than that of the upper part thereof. Although the lattice defect region 115 is in contact with the source region 109 in this embodiment, the lattice defect region 115 may be in contact with either the source region 109 or the drain region 110.

According to this embodiment, in the hole-electron pairs generated in the channel region 114 during the operation of the SOI transistor, electrons flow into the drain region 110 in the same manner as in a conventional transistor. On the other hand, holes move through the channel region 114 towards the source region 109. However, since the lattice defect region 115 is formed between the source region 109 and the channel region 114 and functions as the center of recombination, the holes are eliminated in the lattice defect region 115 because of the recombination. Consequently, unlike a conventional transistor, holes are not accumulated at the end of the channel region closer to the source region, and therefore, it is possible to effectively prevent a bipolar operation from resulting from the accumulation of holes. That is to say, decrease in source/drain breakdown voltage can be prevented with certainty.

Figure 14:
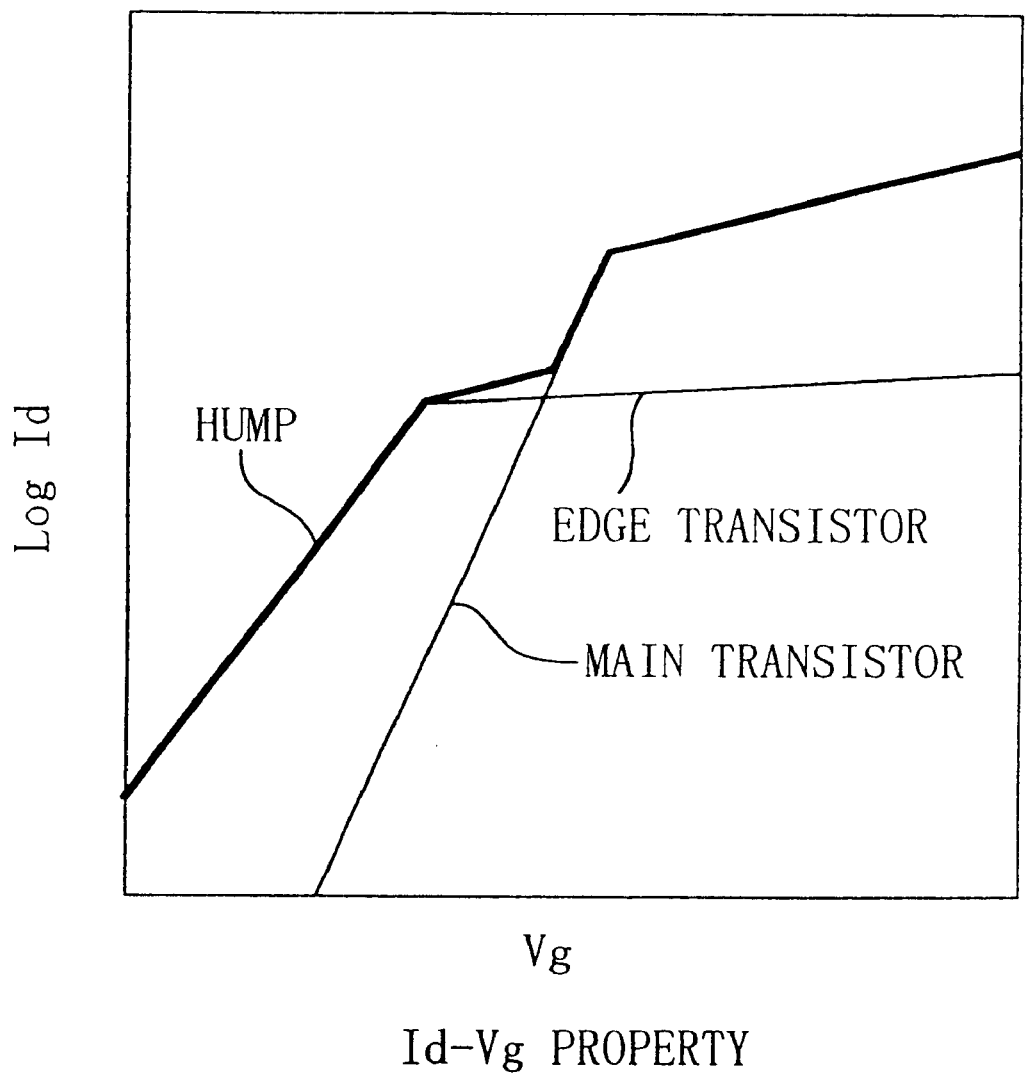
FIG. 14 is a graph illustrating hump phenomenon occurring in sub-threshold characteristics exhibited by the conventional SOI transistor.

Moreover, since the high-concentration channel region 116 is provided in the lower part of the channel region 114, an impurity having a concentration higher than that of the impurity for controlling the threshold value is introduced into the region below the LOCOS film 104. In other words, the impurity concentration in the lower part of the LOCOS film 104 to be the channel of a parasitic transistor (edge transistor) becomes higher than that of the channel region 114 of the original transistor. Thus, since the threshold value of the parasitic transistor becomes higher than that of the original transistor, the original transistor first reaches the threshold value thereof even when the gate voltage is continuously increased. As a result, the influence of the parasitic transistors, i.e., the generation of hump phenomenon in the sub-threshold characteristics resulting from the operation of the edge transistor as shown in FIG. 14, can be eliminated with certainty. Thus, the increase of the OFF leakage current resulting from the parasitic transistor can be suppressed.

The illustration of a method for fabricating the semiconductor device of this embodiment is omitted in the drawings. This is because the local lattice defect region 115 can be formed easily, for example, by performing ion implantation using a mask member having an opening only in the vicinity of the boundary between the source and channel regions.

Embodiment 2

Figure 2:
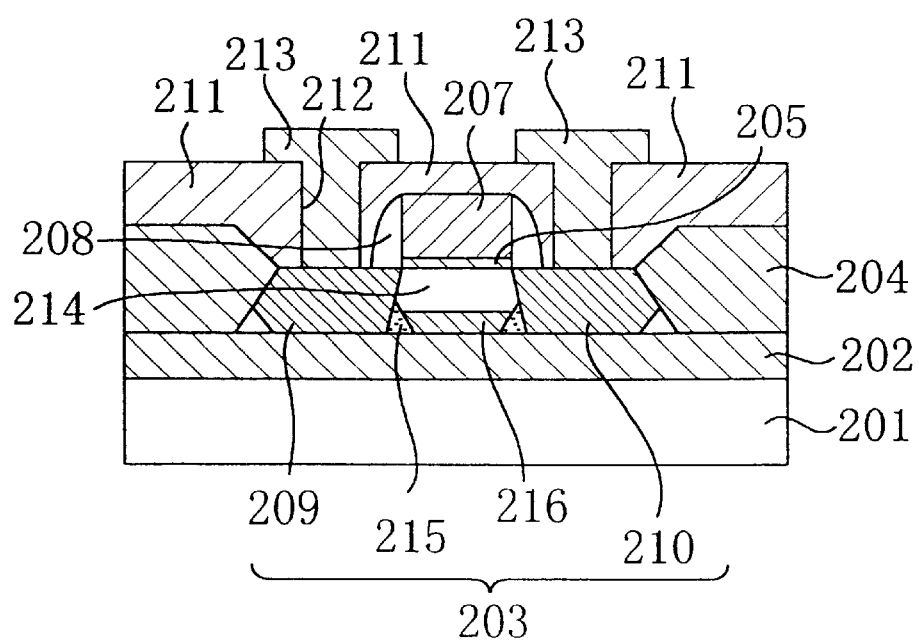
FIG. 2 is a cross-sectional view of an SOI transistor in the second embodiment.

FIG. 2 is a cross-sectional view of a semiconductor device in the second embodiment. As shown in FIG. 2, an insulator layer 202 of an oxide film having a thickness of 80 nm is formed on a p-type single crystalline silicon substrate 201. A silicon layer 203 having a thickness of 100 nm and functioning as an active region for a transistor is formed on the insulator layer 202. A LOCOS film 204 having a thickness of 280 nm is formed to isolate the respective regions of the silicon layer 203 from each other just like islands. A gate oxide film 205 having a thickness of 7 nm is selectively formed on each of the island-shaped, isolated regions of the silicon layer 203, and a gate electrode 207 of polysilicon having a thickness of 200 nm is formed on the gate oxide film 205. Sidewalls 208 having a bottom width of 100 nm are formed on both side faces of the gate electrode 207. The silicon layer 203 includes: a $p^-$-type channel region 214 under the gate electrode 207; and source/drain regions 209, 210 formed of an $n^+$ diffusion layer, the source/drain regions 209, 210 sandwiching the channel region 214 therebetween. An interlevel insulator film 211 having a thickness of 1000 nm is formed over the LOCOS film 204, the gate electrode 207, the source region 209 and the drain region 210. Contact holes 212 having a diameter of 0.5 $\mu$m and reaching the source/drain regions 209, 210 are formed through the interlevel insulator film 211. Furthermore, a metal interconnection layer 213 of aluminum, having a thickness of 700 nm and functioning as an electrode, is formed to fill up the contact holes 212.

This embodiment is characterized by lattice defect regions 215 formed at the bottom of the silicon layer 103 in the region between the channel region 114 and the source region 109 and in the region between the channel region 214 and the drain region 210 by introducing thereto lattice defects as the center of recombination. In addition, in this embodiment, the lower part of the channel region 114 functions as a high-concentration channel region 116 having an impurity concentration higher than that of the upper part thereof.

The semiconductor device of this embodiment can also attain the same effects as those attained by the semiconductor device of the first embodiment. In particular, in this embodiment, even when the potential in either the source region 209 or the drain region 210 reaches a high level, an advantage can be obtained in that it is possible to prevent with certainty a bipolar operation from resulting from the accumulation of holes.

The illustration of a method for fabricating the semiconductor device of this embodiment is omitted in the drawings. This is because the local lattice defect regions 215 can be formed easily, for example, by performing ion implantation using a mask member having an opening only in the vicinity of the boundary between the source and channel regions and in the vicinity of the boundary between the drain and channel regions.

Embodiment 3

Figure 3:
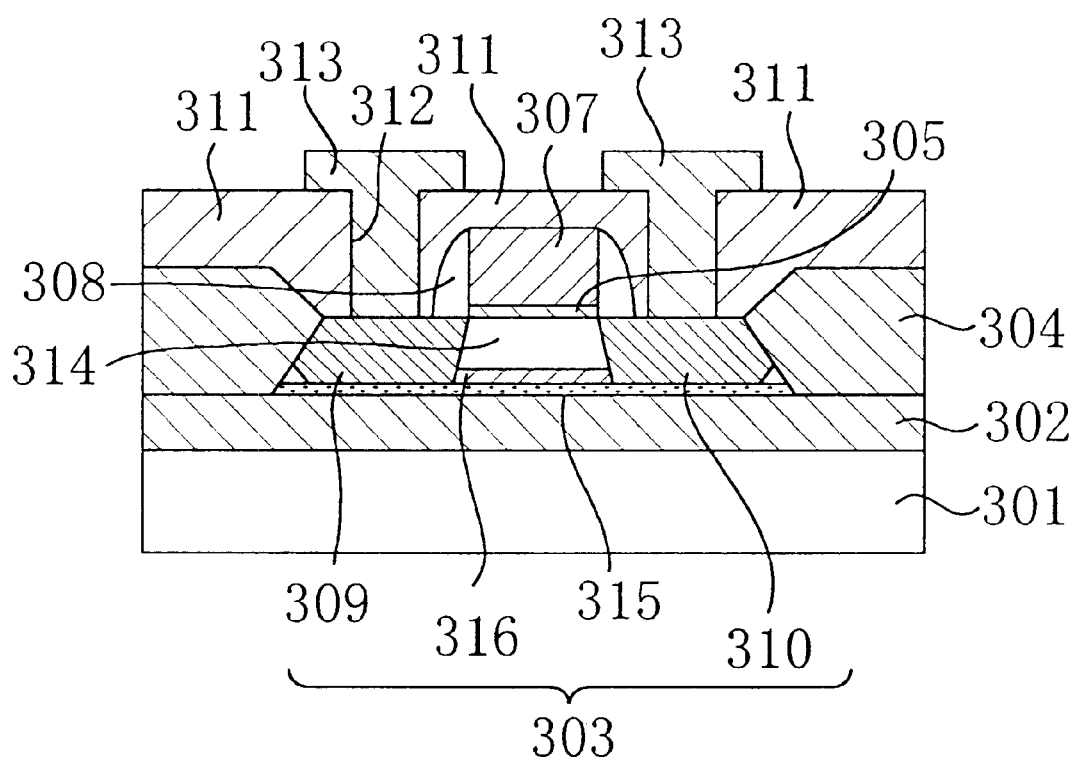
FIG. 3 is a cross-sectional view of an SOI transistor in the third embodiment.

FIG. 3 is a cross-sectional view of a semiconductor device in the third embodiment. As shown in FIG. 3, an insulator layer 302 of an oxide film having a thickness of 80 nm is formed on a p-type single crystalline silicon substrate 201. A silicon layer 303 having a thickness of 100 nm and functioning as an active region for a transistor is formed on the insulator layer 302. A LOCOS film 304 having a thickness of 280 nm is formed to isolate the respective regions of the silicon layer 303 from each other just like islands. A gate oxide film 305 having a thickness of 7 nm is selectively formed on each of the island-shaped, isolated regions of the silicon layer 303, and a gate electrode 307 of polysilicon having a thickness of 200 nm is formed on the gate oxide film 305. Sidewalls 308 having a bottom width of 100 nm are formed on both side faces of the gate electrode 307. The silicon layer 303 includes: a $p^-$-type channel region 314 under the gate electrode 307; and source/drain regions 309, 310 formed of an $n^+$ diffusion layer, the source/drain regions 309, 310 sandwiching the channel region 314 therebetween. An interlevel insulator film 311 having a thickness of 1000 nm is formed over the LOCOS film 304, the gate electrode 307, the source region 309 and the drain region 310. Contact holes 312 having a diameter of 0.5 $\mu$m and reaching the source/drain regions 309, 310 are formed through the interlevel insulator film 311. Furthermore, a metal interconnection layer 313 of aluminum, having a thickness of 700 nm and functioning as an electrode, is formed to fill up the contact holes 312.

This embodiment is characterized by a lattice defect region 315 formed to entirely cover the lower part of the silicon layer 303 by introducing lattice defects to be the center of recombination into the regions between the channel region 314, the source region 309 and the drain region 310, and the insulator layer 302. In addition, in this embodiment, the lower part of the channel region 314 functions as a high-concentration channel region 316 having an impurity concentration higher than that of the upper part thereof.

The semiconductor device of this embodiment can also attain the same effects as those attained by the first and second embodiments. In particular, in this embodiment, since the lattice defect region 315 is formed to entirely cover the lower part of the silicon layer 303, the recombination action of the holes generated during the operation of the transistor is greatly enhanced.

Embodiment 4

A method for fabricating the semiconductor device of the third embodiment will be described as the fourth embodiment. FIGS. 4a to 4e are cross-sectional views illustrating exemplary process steps for fabricating the semiconductor device in this embodiment.

Figure 4A:
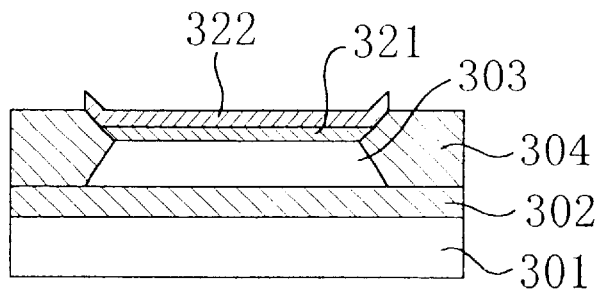
FIGS. 4a to 4e are cross-sectional views illustrating, as the fourth embodiment, an exemplary process for fabricating the semiconductor device of the third embodiment.

First, as shown in FIG. 4a, an insulator layer 302 of an oxide film having a thickness of 80 nm is formed on a p-type single crystalline silicon substrate 301, thereby forming an SOI substrate. After a silicon layer 303 having a thickness of 100 nm is formed on the SOI substrate, a mask consisting of a pad oxide film 321 having a thickness of 10 nm and a nitride film 322 having a thickness of 160 nm is formed on the silicon layer 303. By using the mask, a LOCOS film 304 having a thickness of 280 nm is formed by selective oxidation technique, and the LOCOS film 304 is used to isolate the respective regions of the silicon layer 303 from each other just like islands.

Figure 4B:
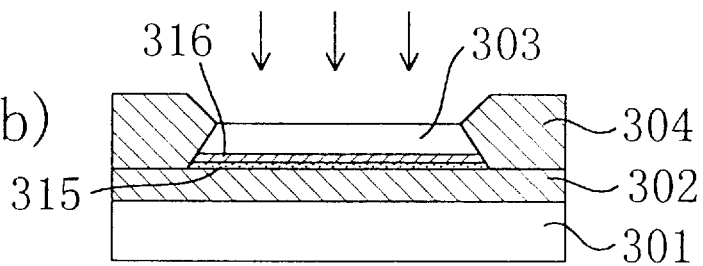

Next, as shown in FIG. 4b, after removing the pad oxide film 321 and the nitride film 322, a p-type impurity, such as indium, having a larger atomic weight than that of silicon is introduced by ion implantation technique such that the concentration of the silicon layer reaches a maximum in a region neighboring the interface between the silicon layer 303 and the insulator layer 302 in order to control the threshold value. In the silicon layer 303, lattice defects are introduced by the introduction of the impurity having a large atomic radius, and as a result, a lattice defect region 315 is formed over the insulator layer 302. On the lattice defect region 315, a high-concentration channel region 316, not containing so many lattice defects but having a higher impurity concentration, is formed. Furthermore, a channel region 314 is formed thereon as a result of the introduction of an impurity at the threshold control level.

FIG. 5 is a graph showing the distribution of impurity concentration in the depth direction of the substrate over the channel region 314, the high-concentration channel region 316 and the lattice defect region 315.

Figure 4C:
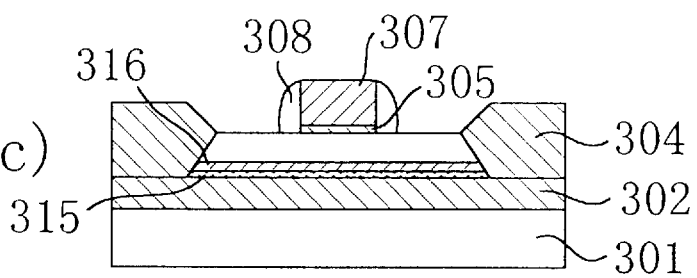

Then, as shown in FIG. 4c, a silicon oxide film having a thickness of 7 nm is formed on the surface of the silicon layer 303 by thermal oxidation, and a polysilicon film having a thickness of 200 nm is deposited on the silicon oxide film by CVD process. Thereafter, the silicon oxide film and the polysilicon film are patterned, thereby forming the gate oxide film 305 and the gate electrode 307. Then, after a silicon oxide film having a thickness of 100 nm is deposited over the entire surface of the substrate, anisotropic etching is conducted to form sidewalls 308 having a bottom width of 100 nm on both side faces of the gate electrode 307.

Figure 4D:
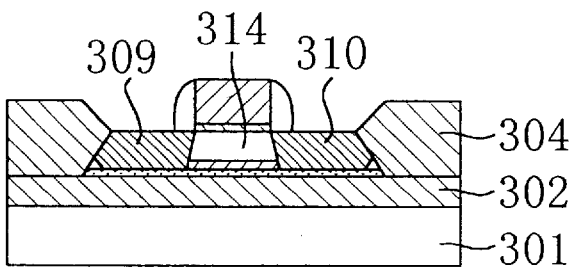

Subsequently, as shown in FIG. 4d, n-type impurity ions are implanted by using the gate electrode 307 and the sidewall 308 as a mask, thereby forming the source region 309 and the drain region 310 to be self-aligned with the gate electrode 307. In the silicon layer 303, the region under the gate electrode 307, i.e., the region between the source/drain regions, becomes the channel region 314. Then, heat treatment is conducted at 950° C. to 1050° C. for 10 to 60 seconds, thereby activating the impurity.

Figure 4E:
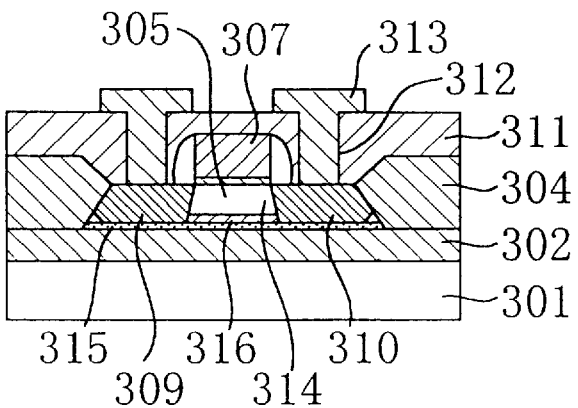

Next, as shown in FIG. 4e, after the interlevel insulator film 311 is deposited, contact holes 312 reaching the source/drain regions 309, 310 are formed and then a metal interconnection layer 313 is formed. By performing these process steps, the semiconductor device having the structure shown in FIG. 3 can be obtained.

According to the fabrication method of this embodiment, in the process step shown in FIG. 4b, the introduction of the impurity for controlling the threshold value of the SOI transistor and the formation of the lattice defect region 315 and the high-concentration channel region 316 are accomplished by performing ion implantation only once (see FIG. 5). Consequently, it is possible to form an SOI transistor exhibiting excellent characteristics, in which the source/drain breakdown voltage is not decreased because of a bipolar transistor operation and the threshold voltage is not decreased because of the operation of a parasitic transistor, by performing an extremely small number of process steps.

Embodiment 5

Next, a method for fabricating a semiconductor device according to the fifth embodiment will be described. This embodiment is a method for fabricating the semiconductor device of the third embodiment in a different way than the method of the fourth embodiment.

FIGS. 6a to 6e are cross-sectional views illustrating exemplary process steps for fabricating the semiconductor device in this embodiment.

Figure 6A:
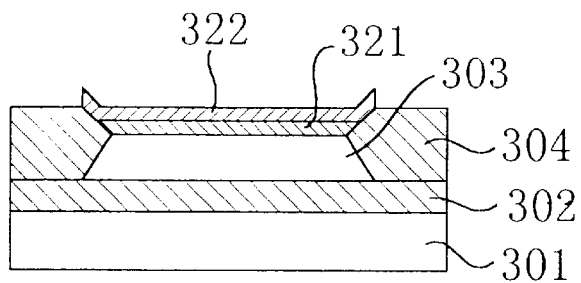
FIGS. 6a to 6e are cross-sectional views illustrating, as the fifth embodiment, another exemplary process for fabricating the semiconductor device of the third embodiment.

First, as shown in FIG. 6a, an insulator layer 302 of an oxide film having a thickness of 80 nm is formed on a p-type single crystalline silicon substrate 301, thereby forming an SOI substrate. After a silicon layer 303 having a thickness of 100 nm is formed on the SOI substrate, a mask consisting of a pad oxide film 321 having a thickness of 10 nm and a nitride film 322 having a thickness of 160 nm is formed on the silicon layer 303. Then, by using the mask, a LOCOS film 304 having a thickness of 280 nm is formed by selective oxidation technique, and the LOCOS film 304 is used to isolate the respective regions of the silicon layer 303 from each other just like islands.

Figure 6B:
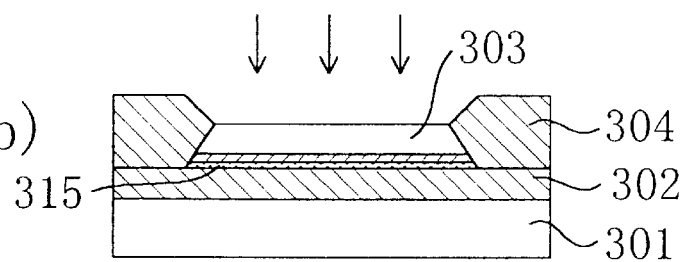

Next, as shown in FIG. 6b, after removing the pad oxide film 321 and the nitride film 322, a p-type impurity, such as boron is implanted such that the concentration of the silicon layer reaches a maximum in a region neighboring the interface between the silicon layer 303 and the insulator layer 302 in order to control the threshold value, thereby forming the channel region 314 and the high-concentration channel region 316.

Subsequently, as shown in FIG. 6b, ions of a Group 4b element (e.g., silicon) or ions of a Group 0 element (e.g., argon) are further implanted with high energy, thereby forming a lattice defect region 315 between the high-concentration channel region 316 and the insulator layer 302.

Figure 6C:
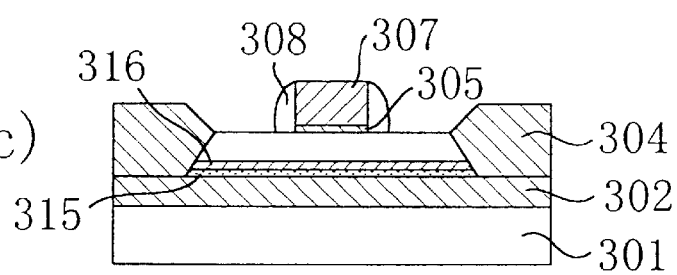

Thereafter, as shown in FIG. 6c, a silicon oxide film having a thickness of 7 nm is formed on the surface of the silicon layer 303 by thermal oxidation, and a polysilicon film having a thickness of 200 nm is deposited on the silicon oxide film by CVD process. Then, the silicon oxide film and the polysilicon film are patterned, thereby forming the gate oxide film 305 and the gate electrode 307. Next, after a silicon oxide film having a thickness of 100 nm is deposited over the entire surface of the substrate, anisotropic etching is conducted to form sidewalls 308 having a bottom width of 100 nm on both side faces of the gate electrode 307.

Figure 6D:
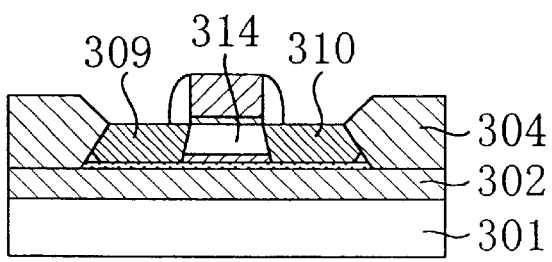

Subsequently, as shown in FIG. 6d, n-type impurity ions are implanted by using the gate electrode 307 and the sidewall 308 as a mask, thereby forming the source region 309 and the drain region 310 to be self-aligned with the gate electrode 307. In the silicon layer 303, the region under the gate electrode 307, i.e., the region between the source/drain regions, becomes the channel region 314. Then, heat treatment is conducted at 950° C. to 1050° C. for 10 to 60 seconds, thereby activating the impurity.

Figure 6E:
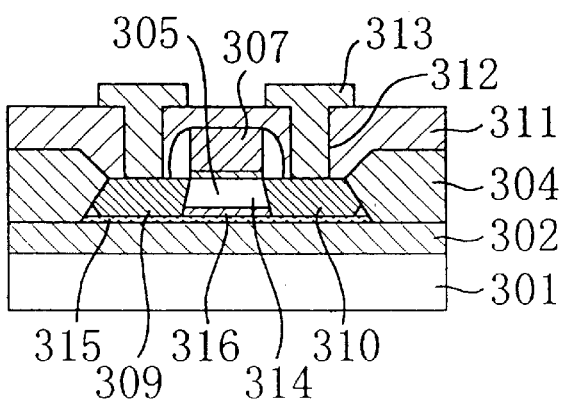

Next, as shown in FIG. 6e, after the interlevel insulator film 311 is deposited, contact holes 312 reaching the source/drain regions 309, 310 are formed and then a metal interconnection layer 313 is formed. By performing these process steps, the semiconductor device having the structure shown in FIG. 3 can be obtained.

Embodiment 6

Next, the sixth embodiment will be described. This embodiment is different from the first and second embodiments in that no sidewalls are provided. Hereinafter, a process for locally forming lattice defect regions between the source/drain regions and the channel region will be described.

FIGS. 7a to 7e are cross-sectional views illustrating exemplary process steps for fabricating the semiconductor device of this embodiment.

Figure 7A:
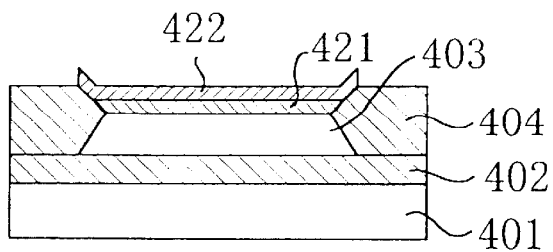
FIGS. 7a to 7e are cross-sectional views illustrating, as the sixth embodiment, an exemplary process for fabricating a semiconductor device having local lattice defect regions.

First, as shown in FIG. 7a, an insulator layer 402 of an oxide film having a thickness of 80 nm is formed on a p-type single crystalline silicon substrate 401, thereby forming an SOI substrate. After a silicon layer 403 having a thickness of 100 nm is formed on the SOI substrate, a mask consisting of a pad oxide film 421 having a thickness of 10 nm and a nitride film 422 having a thickness of 160 nm is formed on the silicon layer 403. Then, by using the mask, a LOCOS film 404 having a thickness of 280 nm is formed by selective oxidation technique, and the LOCOS film 404 is used to isolate the respective regions of the silicon layer 403 from each other just like islands.

Figure 7B:
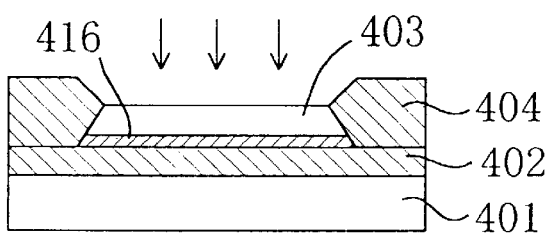

Next, as shown in FIG. 7b, after removing the pad oxide film 421 and the nitride film 422, a p-type impurity, such as boron is implanted such that the concentration of the silicon layer reaches a maximum in a region neighboring the interface between the silicon layer 403 and the insulator layer 402 in order to control the threshold value, thereby forming the channel region 414 and the high-concentration channel region 416.

Figure 7C:
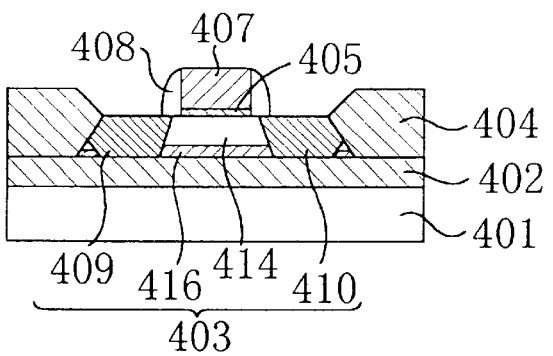

Thereafter, as shown in FIG. 7c, a silicon oxide film having a thickness of 7 nm is formed on the surface of the silicon layer 403 by thermal oxidation, and a polysilicon film having a thickness of 200 nm is deposited on the silicon oxide film by CVD process. Then, the silicon oxide film and the polysilicon film are patterned, thereby forming the gate oxide film 405 and the gate electrode 407. Next, after a silicon oxide film having a thickness of 100 nm is deposited over the entire surface of the substrate, anisotropic etching is conducted to form sidewalls 408 having a bottom width of 100 nm on both side faces of the gate electrode 407. Subsequently, n-type impurity ions are implanted by using the gate electrode 407 and the sidewall 408 as a mask, thereby forming the source region 409 and the drain region 410 to be self-aligned with the gate electrode 407. In the silicon layer 403, the region under the gate electrode 407, i.e., the region between the source/drain regions, becomes the channel region 414. Then, heat treatment is conducted at 950° C. to 1050° C. for 10 to 60 seconds, thereby activating the impurity.

Figure 7D:
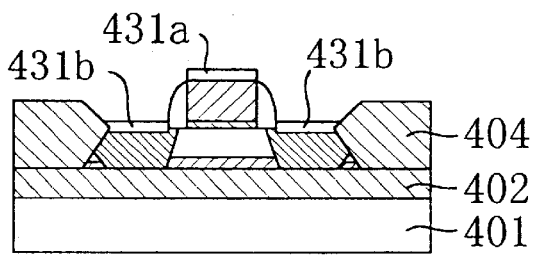

Next, as shown in FIG. 7d, after a refractory metal film (such as titanium film) is deposited over the entire surface of the substrate, the refractory metal is reacted with silicon exposed on the substrate, thereby forming an on-gate silicide film 431a on the gate electrode 407 and an on-substrate silicide films 431b on the source/drain regions 409, 410, respectively.

Figure 7E:
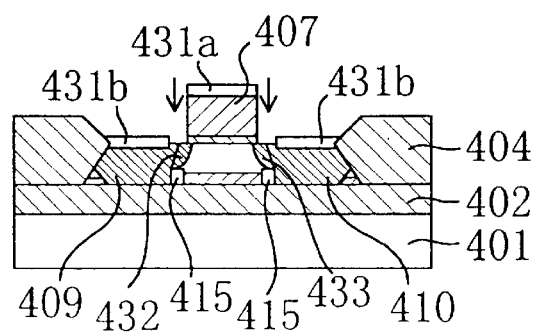

Then, as shown in FIG. 7e, ions of a Group 4b element (e.g., silicon) or ions of a Group 0 element (e.g., argon) are implanted with high energy by using the silicide films 431a, 431b as a mask, thereby forming lattice defect regions 415 in the contact regions among the high-concentration channel region 416, the insulator layer 402, and the source/drain regions 409, 410. Thereafter, low-concentration n-type impurity ions are implanted, thereby forming a low-concentration source region 432 between the channel region 414 and the source region 409 and a low-concentration drain region 433 between the channel region 414 and the drain region 410, respectively.

The illustration of the subsequent process steps is omitted in the drawings. Briefly describing, an interlevel insulator film is deposited over the entire surface of the substrate, contact holes reaching the on-substrate silicide films 431b are formed through the interlevel insulator film and then a metal interconnection layer is formed. By performing these process steps, a semiconductor device obtained by removing the sidewalls from and adding low-concentration source/drain regions to the structure of the semiconductor device shown in FIG. 2 can be formed.

In this embodiment, since the silicide films 431a, 431b are provided, a semiconductor device, having reduced gate and/or contact resistance and attaining the effects of the second embodiment, can be formed easily.

Hereinafter, the types of impurities to be introduced for forming the lattice defect regions in the first to sixth embodiments will be described.

Lattice defects include point defects such as interstitial atoms or holes, line defects such as dislocation and plane defects such as twin crystal or stacking faults. If those defects cause some crystal disorder, an interlevel to be the center of recombination is generated between the conduction band and the valence band, and functions as the center of recombination. Thus, if atoms having a larger atomic radius are introduced out of the impurities having fundamentally the same concentration, then the distortion inside the crystal becomes larger, and a greater number of lattice defects are generated. In particular, if atoms having a larger atomic radius than that of the atoms of the semiconductor composing the semiconductor layer are introduced, then the surrounding regions are largely distorted, no matter whether the atoms exist as interstitial atoms or they are substituted for semiconductor atoms. Thus, the atoms are very likely to cause lattice defects. If ions of an element having a large atomic radius are implanted, a relatively abrupt concentration profile is realized. Thus, a lattice defect region can be easily formed locally so as to reach a predetermined depth. However, it is preferable to introduce atoms not adversely affecting the properties of the semiconductor.

As the elements satisfying these requirements, Group 4b elements not adversely affecting the properties of the semiconductor can be cited. The Group 4b elements include carbon, silicon and germanium, which are especially preferable as impurities for forming a lattice defect region because these elements do not provide conductivity.

Also, the Group 0 elements (inert gas) have no harmful influence on the semiconductor properties, either. Of the Group 0 elements, argon, krypton and xenon, which have a larger atomic weight than that of silicon, are especially preferable.

At present, decrease in the source/drain breakdown voltage resulting from the accumulation of holes in an SOI transistor is especially remarkable in an n-channel type MOS transistor. Therefore, even when the p-type impurity to be introduced into a channel region of an n-channel type MOS transistor, that is, the atoms of a Group 3b element are introduced into a lattice defect region, the characteristics of the transistor are not adversely affected. As in the fourth embodiment, introducing the same impurity into the lattice defect region and the high-concentration channel region at different concentrations bring about an advantage of reducing the number of fabrication process steps. Of the Group 3b elements, gallium, indium, thallium and the like, which have a larger atomic weight than that of silicon, are especially preferable.

It is possible to form a lattice defect region by local heating without introducing any impurity.

In the first to fifth embodiments, sidewalls are provided on both side faces of the gate electrode. However, the sidewalls do not always have to be provided. In the case of providing the sidewalls, an MOS transistor having a so-called LDD structure similar to that of the six embodiment may be formed by conducting ion implantation for forming the low-concentration source/drain regions by using a gate electrode as a mask prior to the formation of the sidewalls, and then conducting ion implantation again for forming high-concentration source/drain regions posterior to the formation of the sidewalls.

The locations where lattice defect regions are formed are not limited to those exemplified in the foregoing embodiments. For example, the lattice defect region may be formed only in the entire lower part of the high-concentration channel region. In such a case, a reversed one of the mask for forming a gate electrode may be used as a mask for ion implantation.

Although the introduction of an impurity into the transistor is conducted by ion implantation in all of the foregoing embodiments, an impurity diffusion layer, except for the lattice defect region, is not necessarily formed by ion implantation, but may be formed by thermal diffusion technique such as a $POCL_3$ diffusion.

Embodiment 7

In this embodiment, a high-concentration diffusion layer for constructing a pn diode with the source region is provided instead of the lattice defect regions of the first to sixth embodiments.

Figure 8:
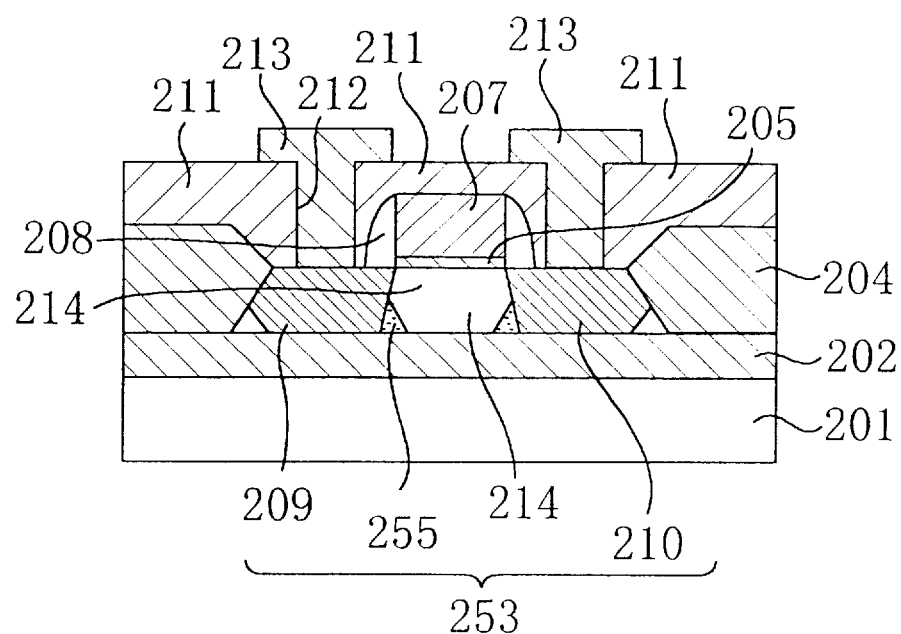
FIG. 8 is a cross-sectional view of an SOI transistor of the seventh embodiment including local high-concentration diffusion layers on right and left ends of the channel region.

FIG. 8 is a cross-sectional view of a semiconductor device in the seventh embodiment. As shown in FIG. 8, the semiconductor device of this embodiment has a similar structure to that of the semiconductor device of the second embodiment shown in FIG. 2. Specifically, an insulator layer 202 of an oxide film having a thickness of 80 nm is formed on a p-type single crystalline silicon substrate 201. A silicon layer 253 having a thickness of 100 nm and functioning as an active region for a transistor is formed on the insulator layer 202. A LOCOS film 204 having a thickness of 280 nm is formed to isolate the respective regions of the silicon layer 253 from each other just like islands. A gate oxide film 205 having a thickness of 7 nm is selectively formed on each of the island-shaped, isolated regions of the silicon layer 253, and a gate electrode 207 of polysilicon having a thickness of 200 nm is formed on the gate oxide film 205. Sidewalls 208 having a bottom width of 100 nm are formed on both side faces of the gate electrode 207. The silicon layer 253 includes: a $p^-$-type channel region 214 under the gate electrode 207; and source/drain regions 209, 210 formed of an $n^+$ diffusion layer, the source/drain regions 209, 210 sandwiching the channel region 214 therebetween. An interlevel insulator film 211 having a thickness of 1000 nm is formed over the LOCOS film 204, the gate electrode 207, the source region 209 and the drain region 210. Contact holes 212 having a diameter of 0.5 $\mu$m and reaching the source/drain regions 209, 210 are formed through the interlevel insulator film 211. Furthermore, a metal interconnection layer 213 of aluminum, having a thickness of 700 nm and functioning as an electrode, is formed to fill up the contact holes 212.

In this embodiment, unlike the semiconductor device of the second embodiment, the silicon layer 253 includes high-concentration diffusion layers 255 formed by introducing a high-concentration p-type impurity into a region between a bottom edge of the channel region 214 and the source region 209 and a region between another bottom edge of the channel region 214 and the drain region 210. Furthermore, in the silicon layer 253, the high-concentration channel region 216 is not provided in the lower part of the channel region 214.

In the semiconductor device of this embodiment, when hole-electron pairs are generated in the channel region 214 during the operation of the semiconductor device, the holes gather in a bottom edge of the silicon layer 253 in the vicinity of the boundary between the channel region 214 and the source region 209. However, since a pn diode is formed between the $p^+$-type high-concentration diffusion layer 255 and the $n^+$-type source region 209, the holes flow into the source region 209 via the pn diode. Consequently, the bipolar operation resulting from the accumulation of holes can be prevented effectively.

In the semiconductor device of this embodiment, the high-concentration diffusion layer 255 is also provided in another bottom edge of the silicon layer 253 in contact with the drain region 210. Consequently, even if the potential in either the source region 209 or the drain region 210 becomes high, the bipolar operation resulting from the accumulation of holes can be prevented with certainty.

In this embodiment, sidewalls are provided on both side faces of the gate electrode. However, the sidewalls do not always have to be provided. In the case of providing the sidewalls, an MOS transistor having a so-called LDD structure similar to that of the fourth embodiment may be formed by conducting ion implantation for forming the low-concentration source/drain regions by using a gate electrode as a mask prior to the formation of the sidewalls, and then conducting ion implantation again for forming high-concentration source/drain regions posterior to the formation of the sidewalls.

Embodiment 8

Figure 9:
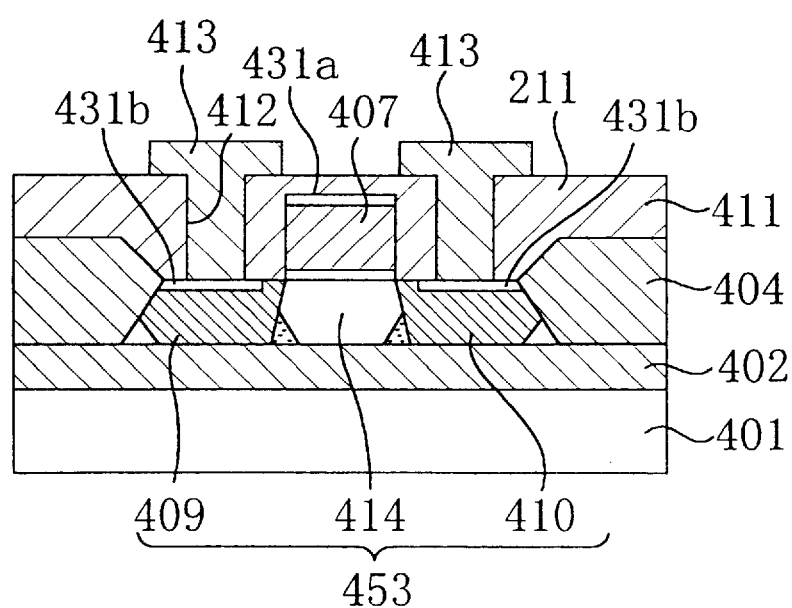
FIG. 9 is a cross-sectional view of a semiconductor device of the eighth embodiment including local high-concentration diffusion layers by utilizing a salicide structure.

FIG. 9 is a cross-sectional view of a semiconductor device in the eighth embodiment. As shown in FIG. 9, the semiconductor device of this embodiment has a similar structure to that of the semiconductor device formed by performing the fabrication process of the sixth embodiment. Specifically, an insulator layer 402 of an oxide film having a thickness of 80 nm is formed on a p-type single crystalline silicon substrate 401. A silicon layer 453 having a thickness of 100 nm and functioning as an active region for a transistor is formed on the insulator layer 402. A LOCOS film 404 having a thickness of 280 nm is formed to isolate the respective regions of the silicon layer 453 from each other just like islands. A gate oxide film 405 having a thickness of 7 nm is selectively formed on each of the island-shaped, isolated regions of the silicon layer 453, and a gate electrode 407 of polysilicon having a thickness of 200 nm is formed on the gate oxide film 405. The silicon layer 453 includes: a $p^-$-type channel region 414 under the gate 20 electrode 407; and source/drain regions 409, 410 formed of an $n^+$ diffusion layer, the source/drain regions 409, 410 sandwiching the channel region 414 therebetween. An interlevel insulator film 411 having a thickness of 1000 nm is formed over the LOCOS film 404, the gate electrode 407, the source region 409 and the drain region 410. Contact holes 412 having a diameter of 0.5 $\mu$m and reaching the source/drain regions 409, 410 are formed through the interlevel insulator film 411. Furthermore, a metal interconnection layer 413 of aluminum, having a thickness of 700 nm and functioning as an electrode, is formed to fill up the contact holes 412.

In this embodiment, unlike the semiconductor device of the sixth embodiment, the silicon layer 453 includes high-concentration diffusion layers 455 formed by introducing a high-concentration p-type impurity into a region between a bottom edge of the channel region 414 and the source region 409 and a region between another bottom edge of the channel region 414 and the drain region 410. Furthermore, in the silicon layer 453, the high-concentration channel region 416 is not provided in the lower part of the channel region 414.

FIGS. 10a to 10e are cross-sectional views illustrating the process steps for fabricating the semiconductor device of this embodiment.

Figure 10A:
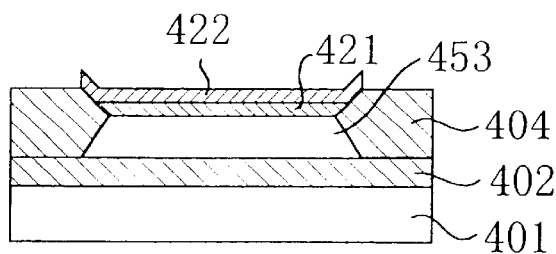
FIGS. 10a to 10e are cross-sectional views illustrating the process steps for fabricating the semiconductor device of the eighth embodiment.

First, as shown in FIG. 10a, an insulator layer 402 of an oxide film having a thickness of 80 nm is formed on a p-type single crystalline silicon substrate 401, thereby forming an SOI substrate. After a silicon layer 453 having a thickness of 100 nm is formed on the SOI substrate, a mask consisting of a pad oxide film 421 having a thickness of 10 nm and a nitride film 422 having a thickness of 160 nm is formed on the silicon layer 453. Then, by using the mask, a LOCOS film 404 having a thickness of 280 nm is formed by selective oxidation technique, and the LOCOS film 404 is used to isolate the respective regions of the silicon layer 453 from each other just like islands.

Figure 10B:
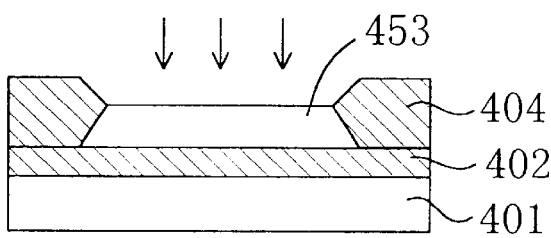

Next, as shown in FIG. 10b, after removing the pad oxide film 421 and the nitride film 422, a p-type impurity, such as boron is implanted in order to control the threshold value.

Figure 10C:
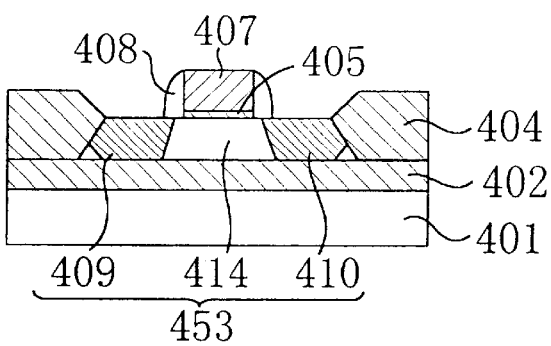

Thereafter, as shown in FIG. 10c, a silicon oxide film having a thickness of 7 nm is formed on the surface of the silicon layer 453 by thermal oxidation, and a polysilicon film having a thickness of 200 nm is deposited on the silicon oxide film by CVD process. Then, the silicon oxide film and the polysilicon film are patterned, thereby forming the gate oxide film 405 and the gate electrode 407. Next, after a silicon oxide film having a thickness of 100 nm is deposited over the entire surface of the substrate, anisotropic etching is conducted to form sidewalls 408 having a bottom width of 100 nm on both side faces of the gate electrode 407. Subsequently, n-type impurity ions are implanted by using the gate electrode 407 and the sidewall 408 as a mask, thereby forming the source region 409 and the drain region 410 to be self-aligned with the gate electrode 407. In the silicon layer 453, the region under the gate electrode 407, i.e., the region between the source/drain regions, becomes the channel region 414. Then, heat treatment is conducted at 950° C. to 1050° C. for 10 to 60 seconds, thereby activating the impurity.

Figure 10D:
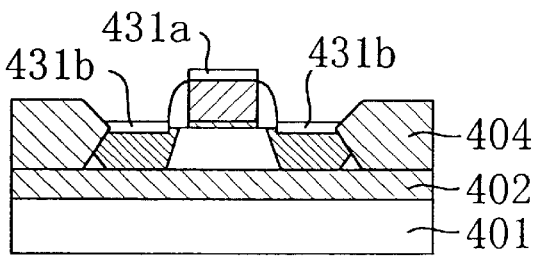

Next, as shown in FIG. 10d, after a refractory metal film (such as titanium film) is deposited over the entire surface of the substrate, the refractory metal is reacted with silicon exposed on the substrate, thereby forming an on-gate silicide film 431a on the gate electrode 407 and an on-substrate silicide films 431b on the source/drain regions 409, 410, respectively.

Figure 10E:
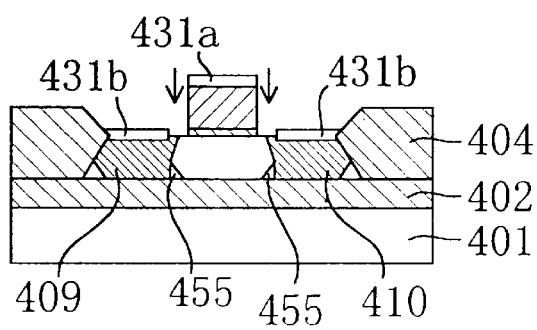
Figure 11:
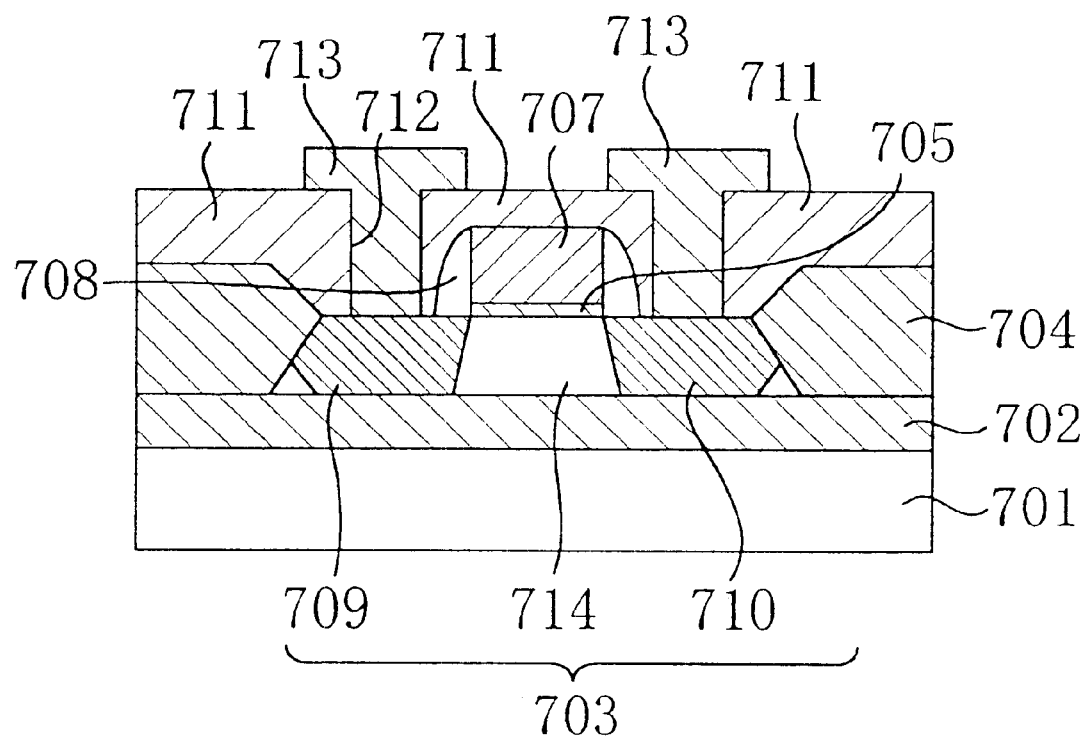
FIG. 11 is a cross-sectional view of a conventional SOI transistor.
Figure 12A:
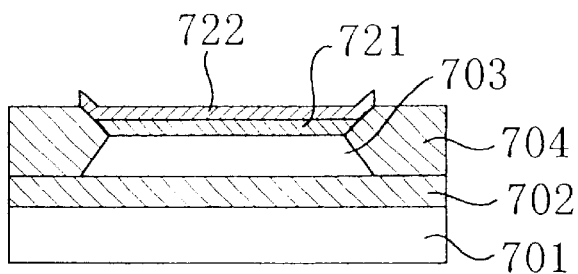
FIGS. 12a to 12e are cross-sectional views illustrating the process steps for fabricating the conventional SOI transistor.
Figure 12B:
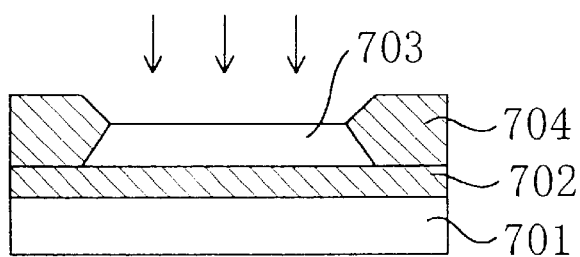
Figure 12C:
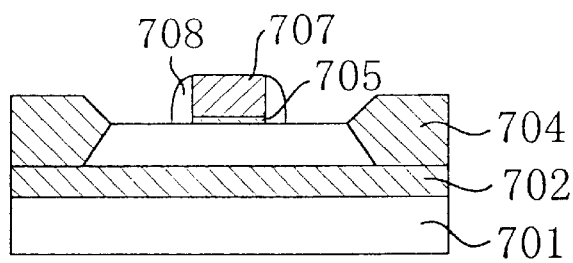
Figure 12D:
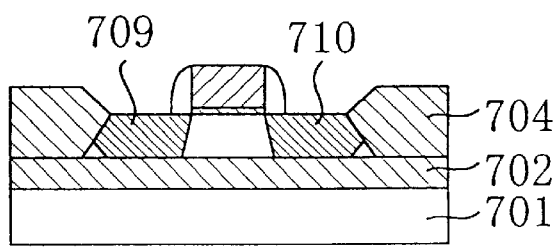
Figure 12E:
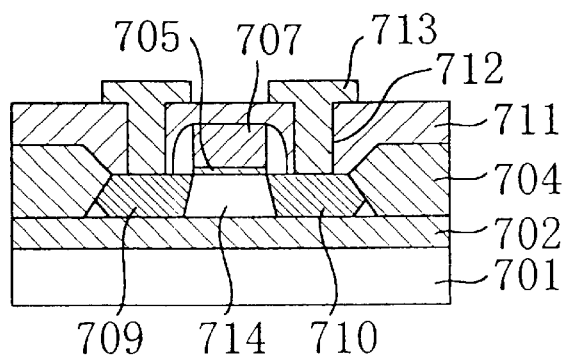
Figure 13A:
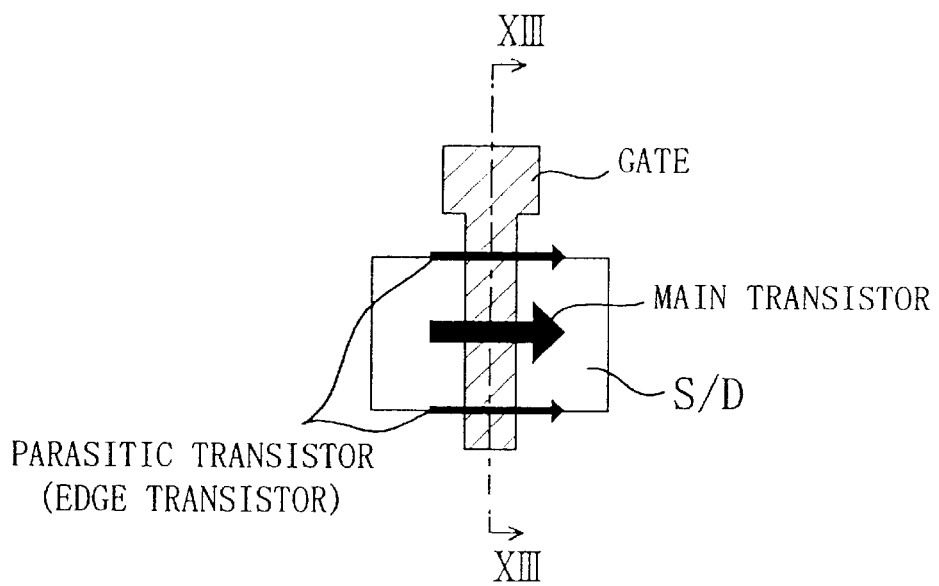
FIGS. 13a and 13b are respectively a plan view and a cross-sectional view taken along the line XIII—XIII for illustrating parasitic transistors in the conventional SOI transistor.
Figure 13B:
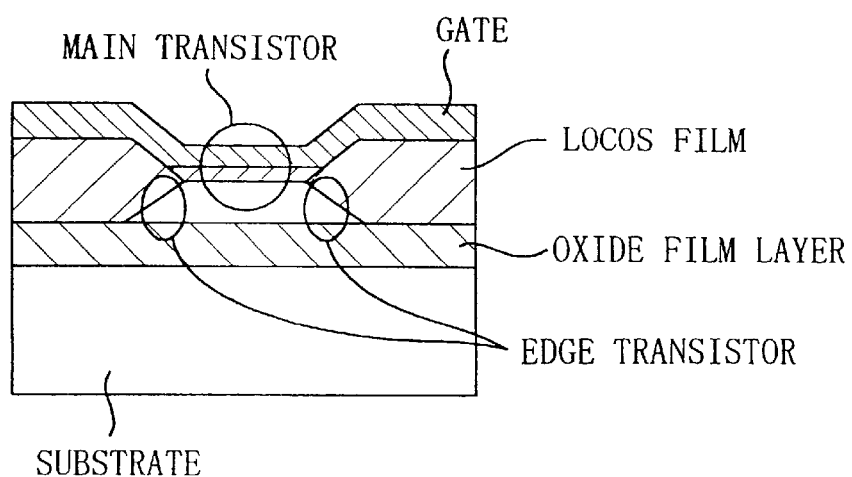

Then, as shown in FIG. 10e, p-type impurity ions are implanted at a dose of about $5 \times 10^{14}/cm^2$ by using the silicide films 431a, 431b as a mask, thereby forming high-concentration diffusion layers 455 between the insulator layer 402 and the source/drain regions 409, 410.

The illustration of the subsequent process steps is omitted in the drawings. Briefly describing, an interlevel insulator film is deposited over the entire surface of the substrate, contact holes reaching the on-substrate silicide films 431b are formed through the interlevel insulator film and then a metal interconnection layer is formed. By performing these process steps, a semiconductor device having the structure shown in FIG. 9 can be formed.

In this embodiment, since pn diodes are formed between the high-concentration diffusion layers 455 and the source/drain regions 409, 410, the same effects as those of the seventh embodiment can be attained.

In addition, since the silicide films 431a, 431b are formed, a semiconductor device having reduced gate and/or contact resistance can be obtained. Moreover, since the high-concentration diffusion layers 455 are formed in extremely narrow areas by the implantation of an impurity through the gaps between the silicide films 431a, 431b and the gate electrode 407, the properties of the source/drain regions 409, 410 are not adversely affected. In other words, in order to form pn diodes between the high-concentration diffusion layers 455 and the source/drain regions 409, 410, carriers having the opposite conductivity type to that of the carriers inside the source/drain regions 409, 410 should be implanted into the high-concentration diffusion layers 455. Therefore, if ion implantation for forming the high-concentration diffusion layers 455 is conducted by using only the gate electrode 407 as a mask, the carrier density in the source/drain regions 409, 410 is largely reduced by counter doping. As a result, the desired characteristics may not be realized for the semiconductor device. By contrast, according to the method of this embodiment, since the high-concentration diffusion layers 455 can be formed only in the vicinity of the bottom edges of the channel region 414, no inconvenience results from the decrease in carrier density of the source/drain regions 409, 410.

In this embodiment, as in the sixth embodiment, low-concentration source/drain regions may be provided between the source/drain regions 409, 410 and the channel region 414 in the vicinity of the surface of the substrate by implanting low-concentration n-type impurity ions with low energy in the process step shown in FIG. 10e.

What is claimed is:

1. A semiconductor device comprising:
   a substrate having an insulator layer thereon;
   a semiconductor layer formed on the insulator layer, part of the semiconductor layer functioning as a channel region of a first conductivity type;
   a gate insulator film formed on the channel region of the semiconductor layer;
   a gate electrode formed on the gate insulator film;
   a source region and a drain region each of a second conductivity type formed in the semiconductor layer so as to sandwich the channel region therebetween, each of the bottom surfaces of the source region and the drain region being in contact with the insulator layer;
   a first lattice defect region formed in a lower region of the semiconductor layer between the channel region and the source region and in contact with the insulator layer, wherein atoms of a Group 3b element or atoms of a Group 0 element, having a larger atomic radius than an atomic radius of an element composing the semiconductor layer are introduced;
   a second lattice defect region formed in a lower region of the semiconductor layer between the channel region and the drain region and in contact with the insulator layer, wherein atoms of the Group 3b element or atoms of the Group 0 element, having a larger atomic radius than the atomic radius of the element composing the semiconductor layer are introduced; and
   a high-concentration channel region formed under a lower part of the channel region between and in contact with the first and second lattice defect regions in the semiconductor layer, the high-concentration channel region is of the first conductivity type and having a concentration higher than a concentration in the channel region.

2. The semiconductor device of claim 1, further comprising: an on-gate silicide film formed on the gate electrode; and on-substrate suicide films formed on the the source region and the drain region, respectively, each of the on-substrate silicide films being spaced from the gate electrode via a gap, the first and second lattice defect regions being located below the respective gaps between the on-substrate silicide films and the gate electrode.

3. The semiconductor device of claim 2 comprising a low-concentration source region and a low concentration drain region, each of the low-concentration source and drain regions being formed above the first and second lattice defect region and among the source region and the drain region and the channel region.

4. The semiconductor device of claim 1, wherein the semiconductor layer is composed of silicon single crystals, and the Group 3*b* element is at least one of gallium, indium and thallium.

5. The semiconductor device of claim 1, wherein the Group 0 element is at least one of argon, krypton, and xenon.

* * * * *